(12) United States Patent
Tharumalingam et al.

(10) Patent No.: US 9,570,649 B2
(45) Date of Patent: *Feb. 14, 2017

(54) METHODS FOR FABRICATING A PLURALITY OF OPTOELECTRONIC DEVICES FROM A WAFER THAT INCLUDES A PLURALITY OF LIGHT DETECTOR SENSOR AREAS

(71) Applicant: Intersil Americas LLC, Milpitas, CA (US)

(72) Inventors: Sri Ganesh A. Tharumalingam, Fremont, CA (US); Seck Jiong Wong, Kuala Lumpur (MY)

(73) Assignee: INTERSIL AMERICAS LLC, Milpitas, CA (US)

( * ) Notice: Subject to any disclaimer, the term of this patent is extended or adjusted under 35 U.S.C. 154(b) by 101 days.

This patent is subject to a terminal disclaimer.

(21) Appl. No.: 14/671,619

(22) Filed: Mar. 27, 2015

(65) Prior Publication Data

US 2015/0207016 A1  Jul. 23, 2015

Related U.S. Application Data

(62) Division of application No. 13/761,708, filed on Feb. 7, 2013.

(Continued)

(51) Int. Cl.
  *H01L 31/16* (2006.01)
  *H01L 31/0232* (2014.01)
  (Continued)

(52) U.S. Cl.
  CPC .............. *H01L 31/16* (2013.01); *G01S 7/4813* (2013.01); *G01S 17/026* (2013.01); *H01L 24/97* (2013.01);
  (Continued)

(58) Field of Classification Search
  CPC ............... H01L 25/167; H01L 31/0232; H01L 27/14625; H01L 27/14687; H01L 23/3121; H01L 27/1218; H01L 51/5237
  (Continued)

(56) References Cited

U.S. PATENT DOCUMENTS 4,764,931 A  8/1988  Matsuda
4,906,839 A  3/1990  Lee
(Continued)

FOREIGN PATENT DOCUMENTS

CN  101055194 A  4/2007
CN  102395859 A  3/2012
(Continued)

OTHER PUBLICATIONS

Office Action dated Feb. 2, 2016, in U.S. Appl. No. 13/761,708, filed Feb. 7, 2013.

(Continued)

*Primary Examiner* — Que T Le
(74) *Attorney, Agent, or Firm* — Vierra Magen Marcus LLP (57) ABSTRACT

Optoelectronic devices (e.g., optical proximity sensors), methods for fabricating optoelectronic devices, and systems including optoelectronic devices, are described herein. An optoelectronic device includes a light detector die that includes a light detector sensor area. A light source die is attached to a portion of the light detector die that does not include the light detector sensor area. An opaque barrier is formed between the light detector sensor area and the light source die, and a light transmissive material encapsulates the light detector sensor area and the light source die. Rather than requiring a separate base substrate (e.g., a PCB substrate) to which are connected a light source die and a light detector die, the light source die is connected to the light (Continued)

detector die, such that the light detector die acts as the base for the finished optoelectronic device. This provides for cost reductions and reduces the total package footprint.

23 Claims, 10 Drawing Sheets

Related U.S. Application Data (60) Provisional application No. 61/660,227, filed on Jun. 15, 2012.

(51) Int. Cl.
*H01L 27/144* (2006.01)
*H01L 23/00* (2006.01)
*H01L 25/16* (2006.01)
*H01L 31/02* (2006.01)
*H01L 31/18* (2006.01)
*G01S 7/481* (2006.01)
*H01L 31/0203* (2014.01)
*H01L 31/173* (2006.01)
*G01S 17/02* (2006.01)

(52) U.S. Cl.
CPC .......... *H01L 25/165* (2013.01); *H01L 25/167* (2013.01); *H01L 27/144* (2013.01); *H01L 27/1446* (2013.01); *H01L 31/02002* (2013.01); *H01L 31/0203* (2013.01); *H01L 31/0232* (2013.01); *H01L 31/173* (2013.01); *H01L 31/18* (2013.01); *H01L 2224/48091* (2013.01); *H01L 2224/48227* (2013.01); *H01L 2924/12036* (2013.01); *H01L 2924/12041* (2013.01); *H01L 2924/12042* (2013.01); *H01L 2924/12044* (2013.01)

(58) Field of Classification Search
USPC .......... 250/551, 214.1, 239, 216; 257/80–85, 257/432–436; 438/57, 64–68
See application file for complete search history.

(56) References Cited

U.S. PATENT DOCUMENTS

| | | | |
|---|---|---|---|
| 5,438,586 A | 8/1995 | Ishii et al. | |
| 6,586,776 B1 | 7/2003 | Liu | |
| 7,026,654 B2 | 4/2006 | Igaki et al. | |
| 7,333,684 B2 | 2/2008 | Shie et al. | |
| 7,351,951 B2 * | 4/2008 | Van Arendonk | H01L 31/0203 250/239 |
| 7,454,104 B2 | 11/2008 | Nakata et al. | |
| 7,633,049 B1 | 12/2009 | Huang et al. | |
| 7,957,448 B2 | 6/2011 | Willemin et al. | |
| 8,406,581 B2 | 3/2013 | Hamamura et al. | |
| 9,305,967 B1 * | 4/2016 | A Tharumalingam | H01L 24/94 |
| 2003/0053769 A1 | 3/2003 | Schunk | |
| 2005/0035356 A1 | 2/2005 | Kek et al. | |
| 2005/0041292 A1 | 2/2005 | Wheatley et al. | |
| 2005/0207697 A1 | 9/2005 | Kek et al. | |
| 2005/0213983 A1 | 9/2005 | Shie et al. | |
| 2006/0049533 A1 | 3/2006 | Kamoshita | |
| 2007/0019902 A1 | 1/2007 | Nakata et al. | |
| 2009/0230563 A1 | 9/2009 | Yamada | |
| 2010/0258710 A1 | 10/2010 | Wiese et al. | |
| 2011/0024627 A1 | 2/2011 | Yao | |
| 2011/0108714 A1 | 5/2011 | Yang et al. | |
| 2013/0334445 A1 | 12/2013 | Tharumalingam et al. | |
| 2016/0041029 A1 | 2/2016 | T'Ng et al. | |

FOREIGN PATENT DOCUMENTS

| | | |
|---|---|---|
| CN | 102472867 A | 5/2012 |
| TW | M363080 U | 8/2009 |

OTHER PUBLICATIONS

Response to Office Action filed Feb. 18, 2016, in U.S. Appl. No. 13/761,708, filed Feb. 7, 2013.
Advisory Action dated Feb. 25, 2016 in U.S. Appl. No. 13/761,708, filed Feb. 7, 2013.
Office Action dated Mar. 23, 2016 in U.S. Appl. No. 14/748,904, filed Jun. 24, 2015.
Amendment dated Apr. 7, 2015, in U.S. Appl. No. 13/761,708, filed Feb. 7, 2013.
Office Action dated Apr. 9, 2015, in U.S. Appl. No. 13/761,708, filed Feb. 7, 2013.
Response to Office Action filed Apr. 27, 2016 in U.S. Appl. No. 14/748,904, filed Jun. 24, 2015.
Office Action dated Apr. 21, 2016 in U.S Appl. No. 13/761,708, filed Feb. 7, 2013.
Response to Office Action filed Jun. 15, 2016 in U.S. Appl. No. 13/761,708, filed Mar. 3, 2013.
Final Office Action dated Jul. 7, 2016 in U.S. Appl. No. 14/748,904, filed Jun. 24, 2015.
Response to Office Action filed May 27, 2015, in U.S. Appl. No. 13/761,708, filed Feb. 7, 2013.
Office Action dated Sep. 4, 2015, in U.S. Appl. No. 13/761,708, filed Feb. 7, 2013.
Response to Office Action filed Oct. 28, 2015, in U.S. Appl. No. 13/761,708, filed Feb. 7, 2013.
Application filed Jun. 24, 2015, in U.S. Appl. No. 14/748,904.
Amendment filed Sep. 4, 2015, in Taiwanese Patent Application No. 102118605 filed May 27, 2015.
Office Action dated Jun. 1, 2016 in Chinese Patent Application No. 201310237072.3.
English Abstract of CN102472867 published May 23, 2012.
English Abstract of CN101055194 published Apr. 13, 2007.
Response to Office Action filed Sep. 12, 2016 in Chinese Patent Application No. 2013102370723.
Office Action dated Sep. 16, 2016 in U.S. Appl. No. 14/671,619.
Response to Office Action filed Sep. 21, 2016 in U.S. Appl. No. 14/748,904.
Office Action dated Aug. 3, 2016, in Taiwanese Patent Application No. 102118605.
Amendment dated Sep. 26, 2016 in Taiwanese Patent Application No. 102118605.
Notice of Allowance dated Sep. 29, 2016 in U.S. Appl. No. 13/761,708.
Office Action dated Nov. 28, 2016, in Chinese Patent Application No. 201310237072.3 filed Jun. 14, 2013.
Amendment dated Dec. 9, 2016, in Chinese Patent Application No. 201310237072.3 filed Jun. 14, 2013.

* cited by examiner

FIG. 5 light source die real estate for light source die attachment

Wire bond pad structure no longer needed.

light detector sensor area

*FIG. 6A* light detector sensor area

TSVs

*FIG. 6B*

0.35 mm pitch 0.20 mm diameter solder ball on package bottom

*FIG. 6C*

0.1 mm all round

METHODS FOR FABRICATING A PLURALITY OF OPTOELECTRONIC DEVICES FROM A WAFER THAT INCLUDES A PLURALITY OF LIGHT DETECTOR SENSOR AREAS

PRIORITY CLAIM

This application is a Divisional of U.S. patent application Ser. No. 13/761,708, filed Feb. 7, 2013, which claims priority under 35 U.S.C. 119(e) to U.S. Provisional Patent Application No. 61/660,227, filed Jun. 15, 2012. Priority is claimed to each of the above applications, each of which is incorporated herein by reference in its entirety.

BACKGROUND

Figure 1:
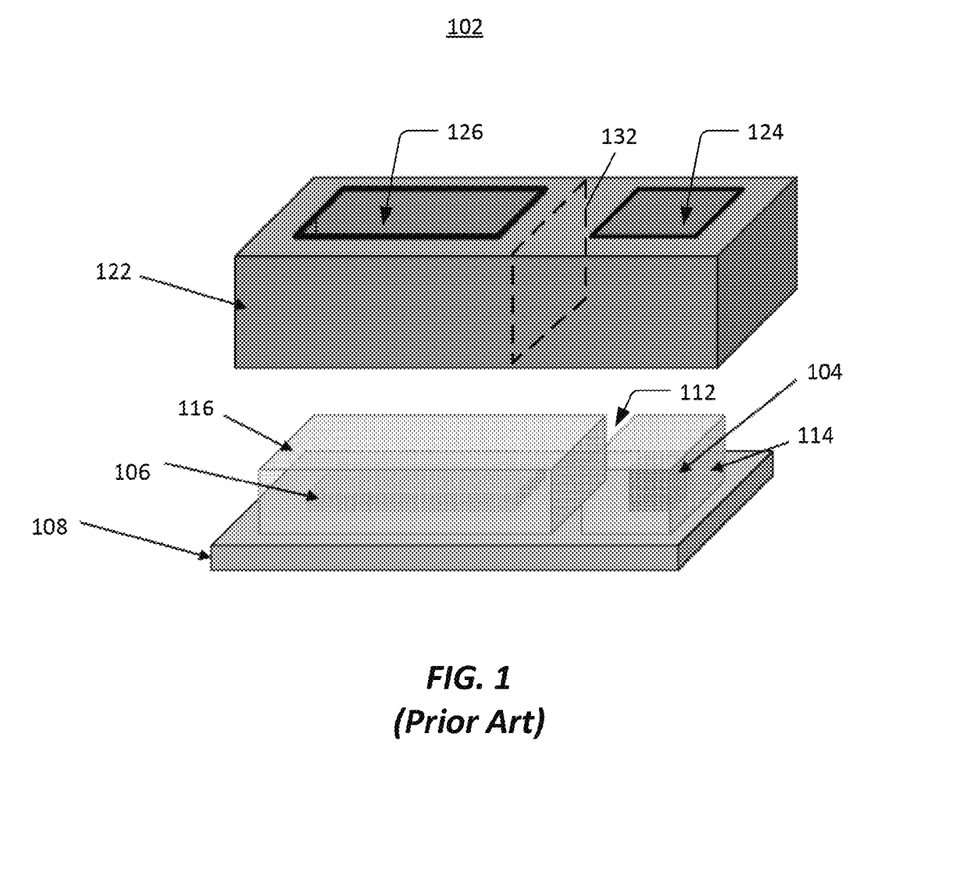
FIG. 1 is a perspective view of an exemplary prior art optical proximity sensor that includes a cover lid, which is shown as being removed.

FIG. 1 is a perspective view of an exemplary prior art optical proximity sensor 102 that includes a cover lid 122, which is shown as being removed. The sensor 102 includes a light source die 104 and a light detector die 106 spaced apart from on another and attached to a base substrate 108 (e.g., a printed circuit board (PCB)). The light source die 104 is encapsulated in a clear epoxy 114, and the light detector die 106 is separately encapsulated in a clear epoxy 116. There is a gap 112 between the clear epoxy 116 encasing the light detector die 106 and the clear epoxy 118 encasing the light source die 104, wherein the gap 112 accepts a crosstalk barrier 132 (that is part of the cover lid 122) when the cover lid 122 is attached to the substrate 108. The cover 122, which is likely made of metal, includes a window 124 for the light source die 104 and separate window 126 for the light detector die 126. The opaque crosstalk barrier 132 (integrally formed with or attached to the cover lid 122) is used to optically isolate the light source die 104 from the light detector die 106.

As can be appreciated from the exemplary prior art optical proximity sensor 102 described with reference to FIG. 1, current packaging of optical proximity sensors involve many components and many process steps, which increase the bill of materials, escalate manufacturing costs, increase cycle times, and incur high yield losses.

BRIEF DESCRIPTION OF THE DRAWINGS

FIG. 3, which includes cross-sectional FIGS. 3(a)-3(i), is used to illustrate the fabrication of optoelectronic devices according to certain embodiments of the present invention.

FIG. 4, which includes cross-sectional FIGS. 4(a)-4(j), is used to illustrate the fabrication of optoelectronic devices according to alternative embodiments of the present invention.

DETAILED DESCRIPTION

Embodiments of the present invention, which are described below, enable the entire processing of optical proximity sensor devices (which can also be used for ambient light sensing) to be performed at the wafer level, thereby reducing the bill of materials and providing high yield manufacturing, resulting in very low cost solutions. Beneficially, the final devices, which can more generally be referred to as optoelectronic devices, are about the size of the light detector dies themselves, resulting in significant miniaturization, making the devices well suited for handheld or other mobile applications.

In the embodiments described below, there is no need for a separate base substrate (e.g., a PCB substrate) to which are connected a light source die and a light detector die. Rather, the light source die is connected to the light detector die, such that the light detector die acts as the base for the finished optoelectronic device. This provides for a significant cost reduction over other proximity sensor devices. Additionally, this reduces the total package footprint to approximately that of the light detector die itself.

Figure 2:
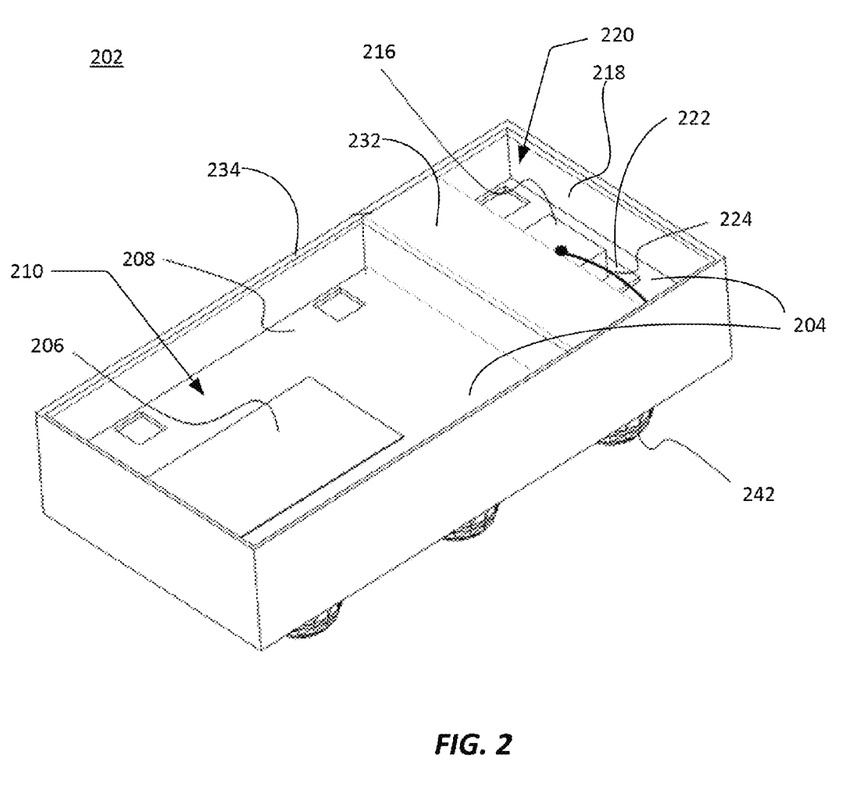
FIG. 2 is a perspective view of an optoelectronic device, according to an embodiment of the present invention, which can be an optical proximity sensor that can also provide ambient light sensing.

FIG. 2 is a perspective view of an optoelectronic device 202, according to an embodiment of the present invention, which can be an optical proximity sensor that can also provide ambient light sensing. As will be understood from the discussion of FIGS. 3-6, in accordance with specific embodiments of the present invention, each of the elements shown in FIG. 2 is either fabricated as part of a wafer, or attached to the wafer during wafer level processing.

Referring to FIG. 2, a light detector sensor area 206 is shown, which was formed within a portion of a wafer (also referred to as the light detector die 204) using any know or future developed wafer level device fabrication process and structure. For example, the light detector sensor area 206 can include an $N^+$ region, which is heavily doped, and a $P^-$ region (e.g., a $P^-$ epitaxial region), which is lightly doped, all of which is formed on a $P^+$ or $P^{++}$ substrate, which is heavily doped. The $N^+$ region and $P^-$ region form a PN junction, and more specifically, a $N^+/P^-$ junction. When this PN junction is reversed biased, e.g., using a voltage source, a depletion region is formed around the PN junction. When light is incident on the light detector sensor area 206, electron-hole pairs are produced in and near the diode depletion region. Electrons are immediately pulled toward $N^+$ region, while holes get pushed down toward $P^-$ region. These electrons (also referred to as carriers) are captured in $N^+$ region and produce a measurable photocurrent indicative of the intensity of the light. This is just one example of the structure of the light detector sensor area 206, which is not meant to be limiting. The light detector sensor area 206 can alternatively include a P+/N− junction, or a PIN, NPN, PNP or NIP junction, but is not limited thereto. Further, it is noted that the light detector sensor area 206 can be made up of a plurality of smaller light detector sensor areas connected together. Regardless of the exact structure of the light detector sensor area 206, the light detector sensor area 206 produces a signal (e.g., a photocurrent) in response to and indicative of incident light.

The light detector sensor area 206 is covered by a light transmissive material 208, which can be, e.g., a light transmissive epoxy (e.g., a clear or tinted epoxy), or other light transmissive resin or polymer. In certain embodiments, the light transmissive material 208 may have a pigment or other property that filters out light of certain wavelengths that are not of interest, while allowing light of wavelengths of interest to pass. The optoelectronic device 202 is also shown as including a light source die 216 encapsulated within a light transmissive material 218, which is likely the same as the light transmissive material 208.

The light source die 216 includes a light emitting element, which can be a light emitting diode (LED), an organic LED (OLED), a bulk-emitting LED, a surface-emitting LED, a vertical-cavity surface-emitting laser (VCSEL), a superluminescent light emitting diode (SLED), a laser diode, or a pixel diode, but is not limited thereto. The light source die 216 includes at least an anode contact and a cathode contact. One of the anode and cathode contacts is located on the bottom of the light source die 216 and is connected to a bond pad on the top surface of the light detector die 204. The other one of the anode and cathode contacts is located on the top surface of the light source die 216 and is connected by a bond wire 224 to a bond pad on the top surface of the light detector die 204. Further, it is noted that the light source die 216 can include a plurality of light emitting elements connected together, e.g., serially and/or in parallel.

The light detector die 204 can also include other circuitry, such as, amplifier circuitry that is used to amplify the photocurrent produced by the light detector sensor area 206 and/or driver circuitry that is used to selectively drive the light emitting element(s) of the light source die 216. It would also be possible for the driver circuitry to alternatively be part of the light source die 216, or to be external to the dies 204 and 216.

An opaque crosstalk barrier 232 is located between the light detector sensor area 206 and the light source die 216 to thereby optically isolate the light emitting element(s) of the light source die 216 from the light detector sensor area 206. The opaque crosstalk barrier 232 can be formed from an opaque material, which can be, e.g., a black or other dark epoxy, or other resin or polymer that is non-transmissive to the light generated by the light source die 216. The opaque material that forms the opaque crosstalk barrier 232 also forms a peripheral barrier 234 around the entire periphery of the device 202, so as to optically isolate the device 202 from one or more other optoelectronic device(s) that may be located in the vicinity of the device 202. In specific embodiments, the opaque crosstalk barrier 232 and peripheral barrier 234 is formed using black solder mask material.

A window 210 is located over the light detector sensor area 206, and a window 220 is located over the light source die 216. While the windows 210 and 220 are shown as being simple apertures or openings, more complex windows can be formed.

Figure 3:
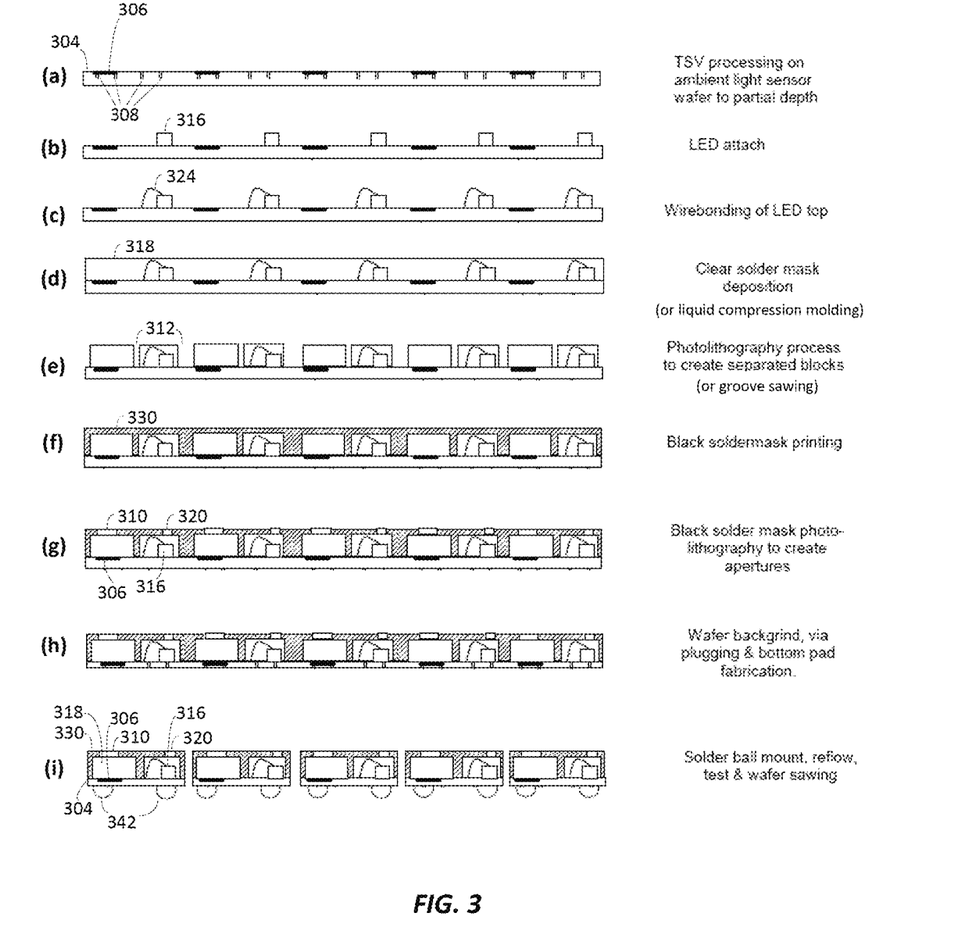

FIG. 3, which includes cross-sectional FIGS. 3(a)-3(i), is used to illustrate the fabrication of an optoelectronic device (and more specifically, a plurality of such devices), according to certain embodiments of the present invention. For example, the process described with reference to FIG. 3 can be used to produce the optoelectronic device 202, described above with reference to FIG. 2.

Referring to 3(a), a plurality of light detector sensor regions 306 are shown as being formed in a silicon wafer 304. Through silicon via (TSV) processing is performed to form the vias 308 that will provide electrical connections between components connected to the top of the wafer 304 and the electrical contacts (e.g., solder balls) which will be formed on a bottom of the wafer after the wafer is back-grinded. For example, standard TSV processing with plasma etch can be used to form the openings (hole drilling) to partial depth of the wafer 304. The partial depth TSV process can be performed at an initial stage or final stage of CMOS device fabrication. At this stage there is no plastic material deposited on the wafer. Accordingly, copper (Cu) seeding, Cu plating, via filling and chemical mechanical polishing/planarization (CMP) can be performed without process constraints.

Referring to FIG. 3(b), a plurality of light source dies 316 are connected to bond pads on the top surface of the wafer 304. For example, the wafer 304 can be loaded onto a die attachment machine and held in place by a wafer holder. The light source dies 316 can be attached, e.g., using an electrically conductive epoxy, such as, but not limited to, a silver (Ag) epoxy. This will connect either the anode or the cathode of the light emitting element(s) of each light source die 316 to a respective bond pad on the top surface of the wafer 304. The wafer then goes through a baking process to cure the electrically conductive epoxy (e.g., the Ag epoxy).

Referring to FIG. 3(c), a wafer level bonding machine is then used to connect a bond wire 324 from the other terminal (e.g., the cathode or anode) of the light emitting element of each light source die 316 to a respective bond pad on the wafer 304. The bond wires 324 can be made, e.g., of silver (Ag) or copper (Cu), but are not limited thereto.

Referring to FIG. 3(d), the top surface of the wafer 304 and the elements connected thereto, including the light source dies 316 and the bond wires 324 are encapsulated in a light transmissive material 318. The light detector sensor regions 306 are also encapsulated in the light transmissive material 318. The light transmissive material 318 can be, e.g., a light transmissive epoxy (e.g., a clear or tinted epoxy), or other light transmissive resin or polymer. In accordance with specific embodiments, the light transmissive material 318 is a clear solder mask material that is dispensed using solder mask deposition equipment. In accordance with alternative embodiments, the light transmissive material 318 (e.g., a clear epoxy) is formed using liquid compression molding, with or without vacuum assist.

Referring to FIG. 3(e), grooves 312 are formed in the light transmissive encapsulating material 318 to separate encapsulated light detector sensor regions 306 from adjacent encapsulated light source dies 316. In accordance with certain embodiments, photolithography is used to form the grooves 312. In accordance with other embodiments, the grooves 312 are cut, e.g., using a saw or a laser.

Referring to FIG. 3(f), an opaque material 330 is dispensed over the remaining light transmissive material 318 and within the grooves 312 discussed with reference to FIG. 3(e). The opaque material 330 is used to form a crosstalk barrier (between each light detector sensor region 306 and its adjacent light source die 316) and a peripheral barrier, the purposes of which were discussed above with reference to elements 232 and 234 in FIG. 2. The opaque material 330 can be, e.g., a black or other dark epoxy, or other resin or polymer that is non-transmissive to the light generated by the light source die 316. In specific embodiments, the opaque material is a black solder mask material that is dispensed using solder mask printing.

After wafer level processing to form the light transmissive material and to form the opaque barriers, the wafer can be attached to a wafer support system e.g., using an acrylic based adhesive. The wafer support system will help prevent warping and help protect the light transmissive material 318 and the barriers from temperature excursions.

Referring to FIG. 3(g), windows 310 are formed for the light detector sensor regions 306, and windows 320 are formed for the light source dies 316. In accordance with specific embodiments, these windows 310, 320, which can also be referred to as apertures, can be formed by removing portions of the opaque material 330 (e.g., black solder mask material) using photolithography.

Referring to FIG. 3(h), after the windows have been formed, wafer backgrinding, via plugging and bottom pad fabrication are performed. The wafer backgrinding thins the wafer 304 to its final desired thickness, and also exposes the TVS vias. For example, the wafer may start out having a 30 mil thickness, and may end up with a thickness of about 5 mils after the backgrinding. This significantly reduces the thickness of the final devices.

Upon backgrinding to thin the wafer and to expose the TSV vias, low temp Ti-1 kA and Cu-2 kA can be deposited as a seed layer, e.g., at temperature less than 110 degrees Celsius. Subsequently CuNiAu can be deposited via a plating method to create bottom I/Os for external contact (e.g., solder ball) attachment. The opaque material (e.g., solder mask) and light transmissive material (e.g., clear epoxy) are preferably chosen to withstand peak reflow temperatures of 240-250 degrees Celsius.

Referring to FIG. 3(i), solder balls 342 are shown as being mounted to the bottom of the wafer 304. More specifically, the wafer 304 can be subjected to flux print, solder ball attachment and reflow to produce the solder ball terminals on the bottom of the wafer 304. It is also within the scope of the present invention for alternative contacts to be used instead of solder balls. For example, electrically conductive lands, pads or pegs can be used. Laser markings can also be added to the bottom of the wafer 304.

Still referring to FIG. 3(i), the wafer is then mechanically diced (e.g., sawn) to singulate each optoelectronic device. In accordance with an embodiment, after the dicing, the devices remain attached to a tape (e.g., Mylar tape) medium used to mount the wafer. The singulated devices can then be tested using an electrical tester (e.g., a tester having probes) to check whether the individual devices are operating properly. Alternatively, the testing can be performed prior to the dicing. The singulated devices can then be loaded onto a pick and place machine that is used to pick the devices that operate properly (as determined using the testing) and place them into tape and reel packing, at which point they are ready for shipping to customers.

Figure 4:
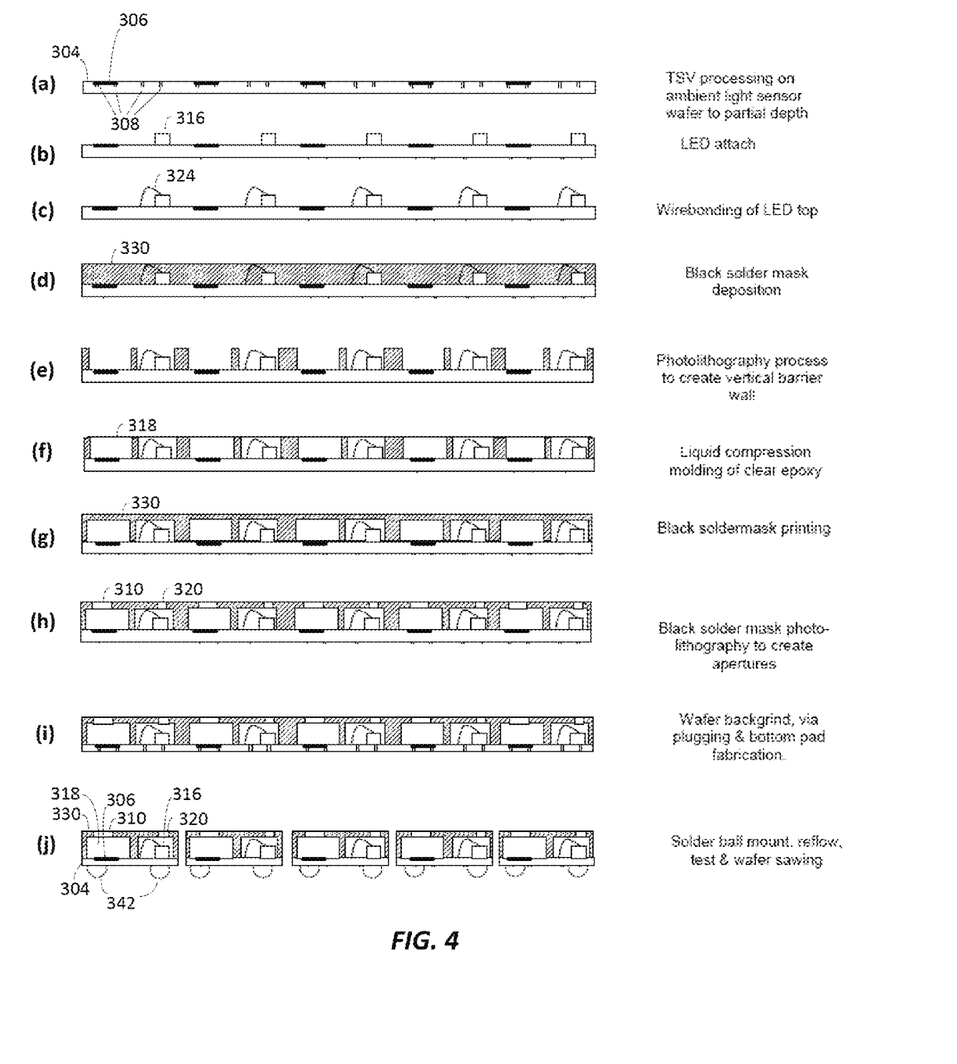

FIG. 4, which includes cross-sectional FIGS. 4(a)-4(j), is used to illustrate the fabrication of an optoelectronic device (and more specifically, a plurality of such devices), according to alternative embodiments of the present invention. FIGS. 4(a)-4(c) are identical to FIGS. 3(a)-3(c), and thus, need not be described again.

Referring to FIG. 4(d), the top surface of the wafer 304 and the elements connected thereto, including the light source dies 316 and the bond wires 324 are encapsulated in an opaque material 330. In specific embodiments, the opaque material is a black solder mask material that is dispensed using solder mask printing.

Referring to FIG. 4(e), photolithography is used to remove portions of the opaque material 330 that covered the light detector sensor regions 306 and the light source dies 316, so that the remaining opaque material 330 form a crosstalk barrier (between each light detector sensor region 306 and its adjacent light source die 316) and a peripheral barrier.

Referring to FIG. 4(f), a light transmissive material 318 is then used to cover and encapsulate the light detector sensor regions 306 the light source dies 316 and the bond wires 324. As mentioned above, the light transmissive material 318 can be, e.g., a light transmissive epoxy (e.g., a clear or tinted epoxy), or other light transmissive resin or polymer. In accordance with specific embodiments, liquid compression molding is used to mold the light transmissive material 318 (e.g., a clear epoxy).

Referring to FIG. 4(g), additional opaque material 330 is then dispensed, e.g., using black solder mask printing.

FIGS. 4(h)-4(j) are identical to FIGS. 3(g)-3(i), and thus, need not be described again.

Figure 5:
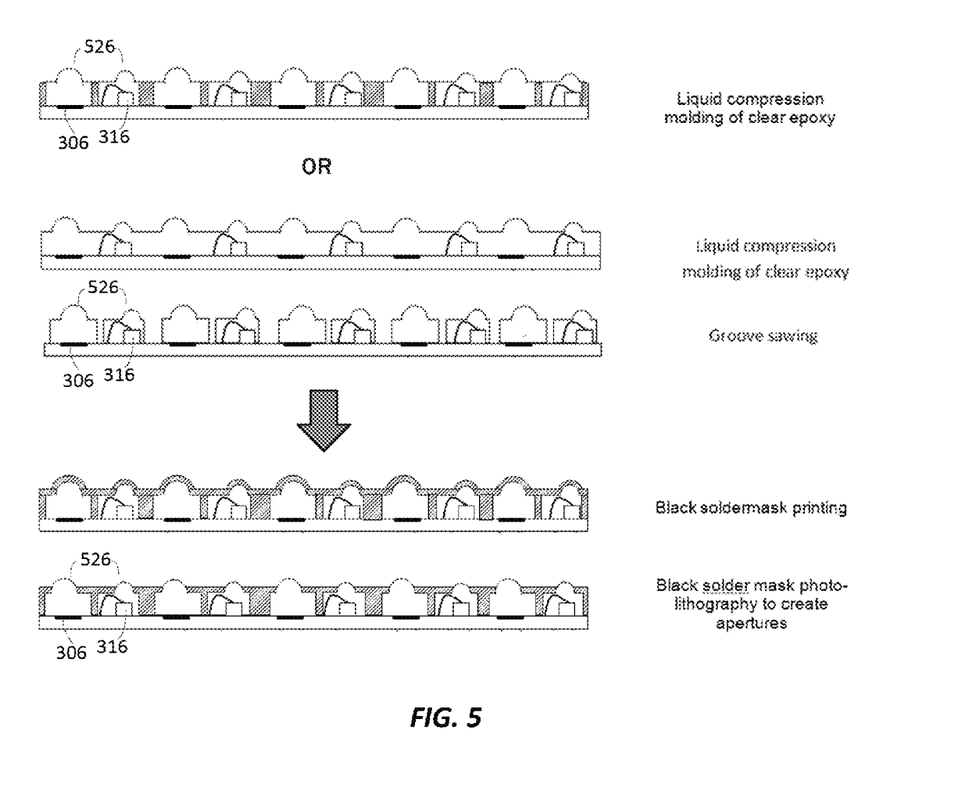
FIG. 5 includes cross-sections that are used to illustrate that lenses, e.g., bubble lenses, can be formed over the light detector sensor regions and/or the light source dies, in accordance with certain embodiments.

In certain embodiments, lenses, e.g., bubble lenses, can be formed over the light detector sensor regions and/or the light source dies, as can be appreciated from FIG. 5. Referring to FIG. 5, such lenses 526 can be formed, e.g., using liquid compression molding of the light transmissive material 318 (e.g., a clear epoxy). The lens over each light source die is used to focus light being emitted from the light source die. The lens over each light detector sensor region is used to focus light (reflected and/or ambient light) that is incident on the lens.

In the embodiments described above, there is no need for a separate base substrate (e.g., a PCB substrate) to which are connected a light source die and a light detector die. Rather, the light source die is connected to the light detector die, such that the light detector die acts as the base for the finished optoelectronic device. This provides for a significant cost reduction over other proximity sensor devices. Additionally, this reduces the total package footprint to approximately that of the light detector die itself. The resulting optoelectronic device(s) can be used for proximity detection, as well as for ambient light detection.

In accordance with specific embodiments described above, only a single bond wire is needed for each optical proximity sensor device. The rest of the electrical connections are routed by vias to the back of the die and finished with solder balls or other external connectors. This allows for package miniaturization. Additionally, the bill of materials is less prone to increase if the price of commodities used to produce bond wires (such as silver (Ag) or copper (Cu)) increase.

The embodiments that use wafer level liquid compression molding, or clear solder deposition, provide significant cost savings over transfer molding, which is often used to make other proximity sensor devices.

For those embodiments that form the opaque barriers (the crosstalk barrier between the light source die and the light detector sensor area, and the peripheral barrier) using black solder mask printing, such a wafer level process allows for high accuracy and high manufacturing yield, which provides cost savings.

In specific embodiments, the components of the optoelectronic devices are formed using wafer level chip scale packaging (CSP), which provides for extensive miniaturization.

Figures 6A, 6B:
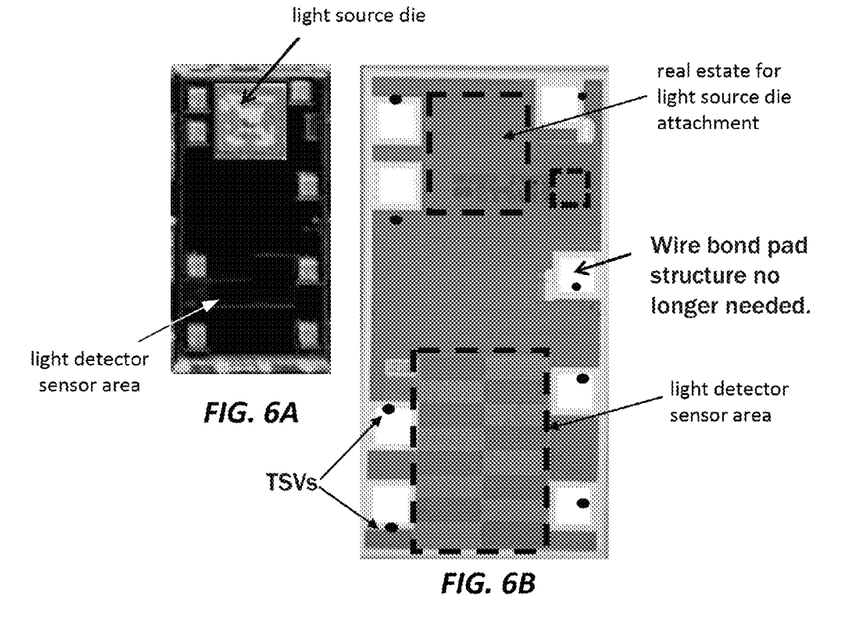
FIG. 6A illustrates a top view of an optoelectronic device according to an embodiment of the present invention.
FIG. 6B illustrates a top view of the optoelectronic device of FIG. 6A, with the light source die removed.
Figure 6C:
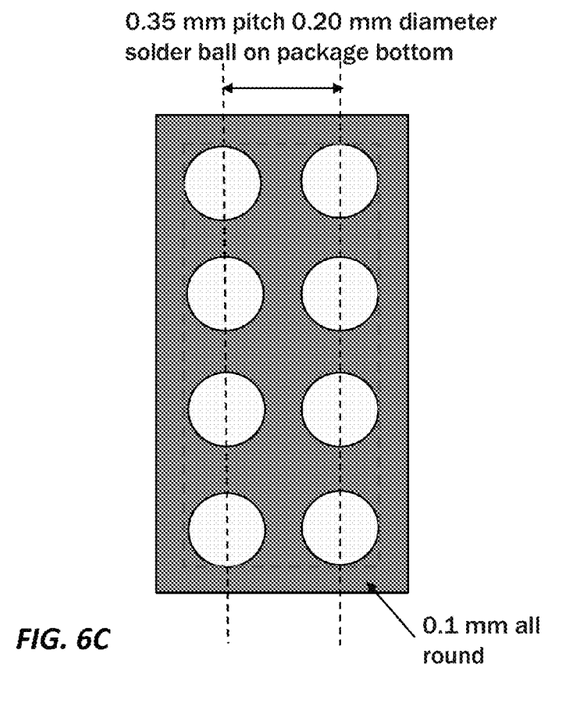
FIG. 6C illustrates a bottom view of the optoelectronic device of FIG. 6A.

FIG. 6A illustrates a top view of an optoelectronic device according to an embodiment of the present invention. FIG. 6B illustrates a top view of the optoelectronic device of FIG. 6A, with the light source die removed. FIG. 6B illustrates a bottom view of the optoelectronic device of FIG. 6A.

Figure 7:
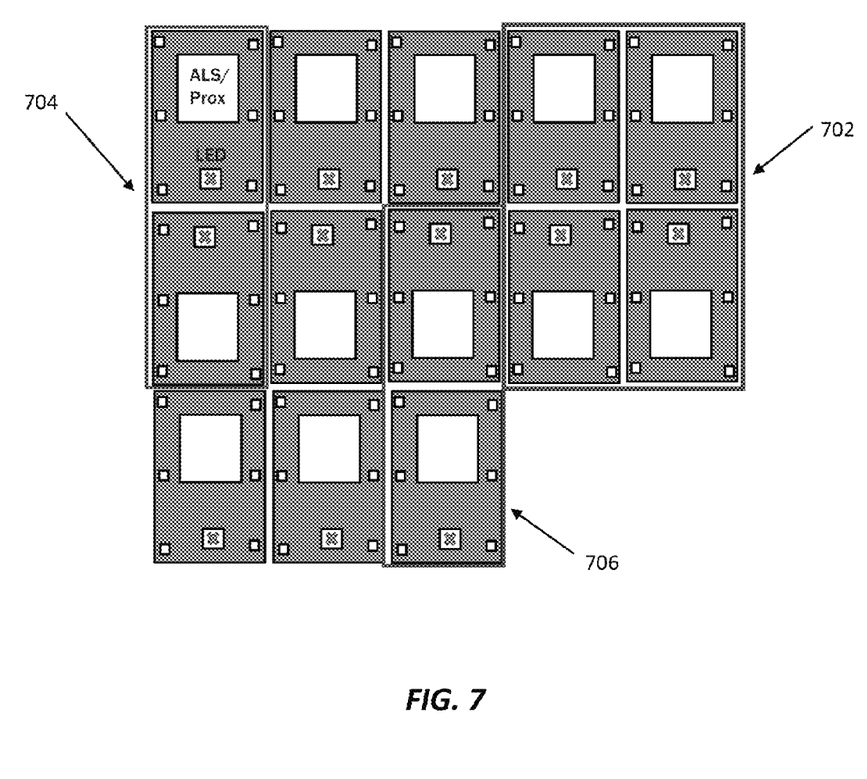
FIG. 7 is used to illustrate that in accordance with certain embodiments, dicing can be performed so that an array of sensors is included in a single package.

In accordance with certain embodiments, rather then performing the dicing so that each resulting device only includes a single proximity sensor, the dicing can alternatively be performed so that an array of such sensors is included in a single package, as can be appreciated from FIG. 7. More specifically, FIG. 7 shows an array of four optoelectronic devices in one package 702, an array of two optoelectronic devices 704 where the light source dies are spaced close to one another, and an array of two optoelectronic devices 706 where the light source dies are spaced farther apart from one another. Other configurations are also possible.

Figure 8A:
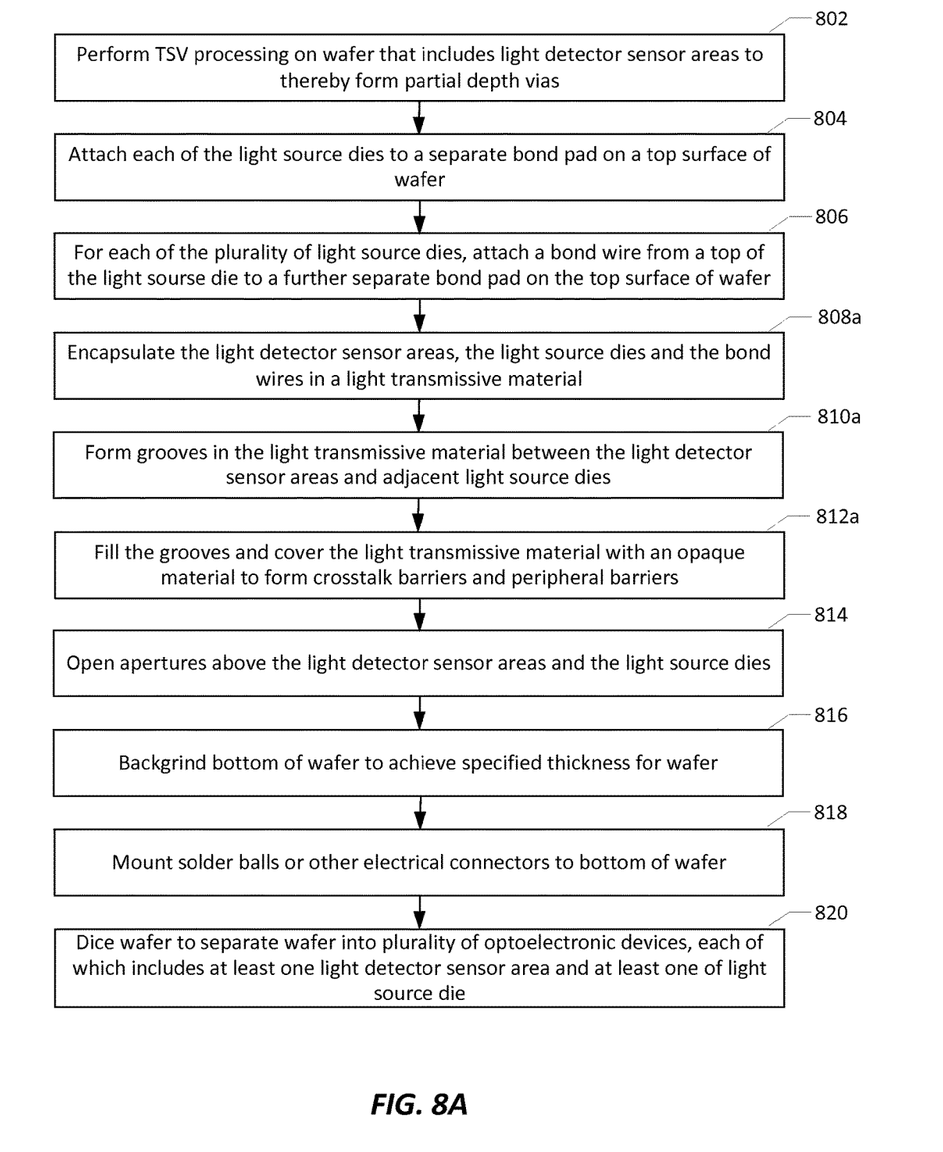
FIGS. 8A and 8B are high level flow diagrams that are used to summarize methods for fabrication optoelectronic devices according to various embodiments of the present invention.
Figure 8B:
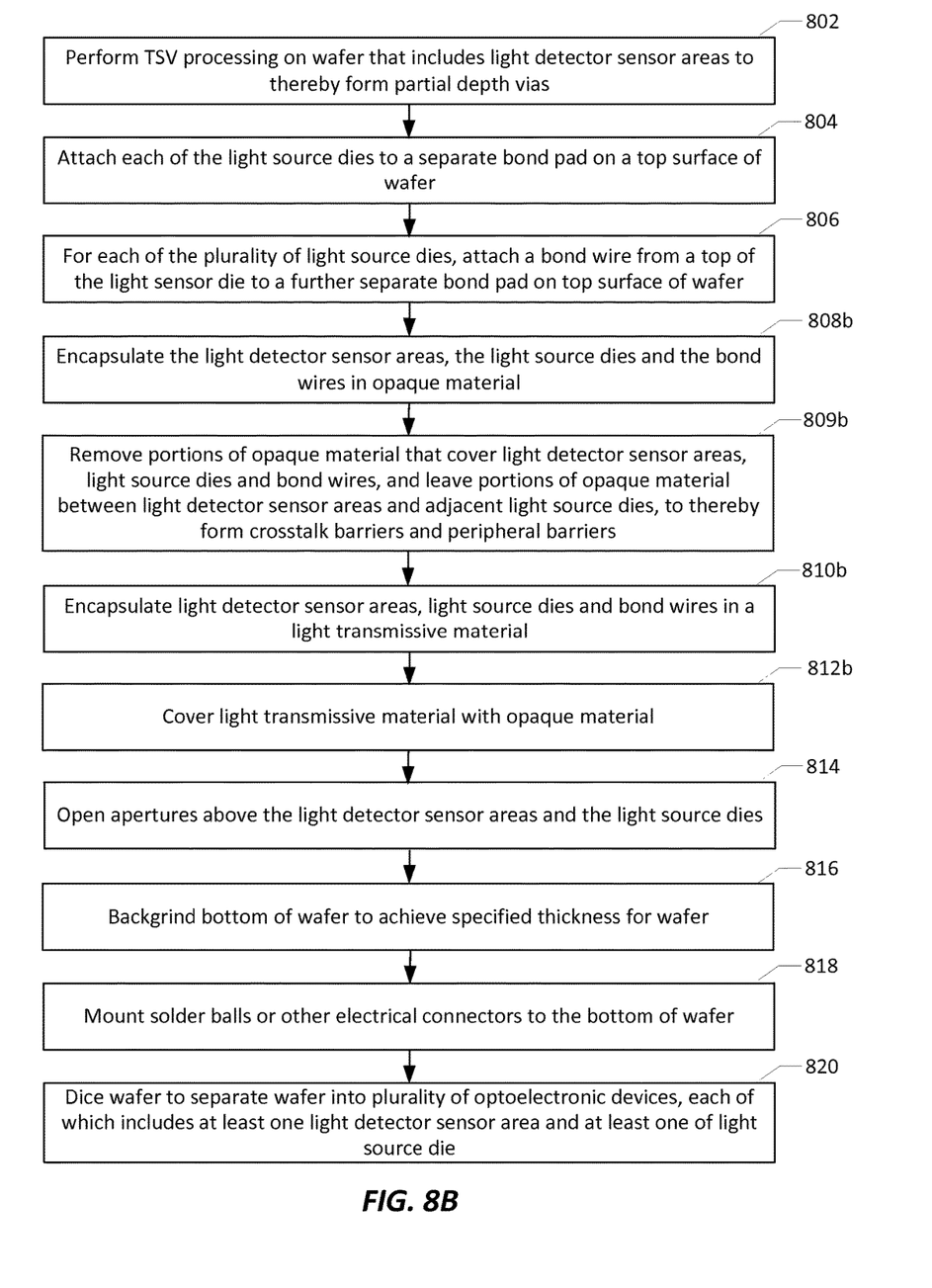

FIGS. 8A and 8B are high level flow diagrams that are used to summarize methods for fabricating a plurality of optoelectronic devices according to various embodiments of the present invention. The flow diagram of FIG. 8A corresponds to the process described above with reference to FIG. 3. The flow diagram of FIG. 8B corresponds to the process described above with reference to FIG. 4. Steps 802, 804 and 806, 814, 816, 818 and 820 are the same in both FIGS. 8A and 8B. Steps 808a, 810a and 812a in FIG. 8A differ from steps 808b, 809b, 810b and 812b in FIG. 8B.

Referring to FIG. 8A, at step 802, through silicon via (TSV) processing is performed on a wafer that includes a plurality of light detector sensor areas to thereby form a plurality of partial depth vias. At step 804, each of the light source dies is attached to a separate bond pad on a top surface of the wafer. At step 806, for each of the plurality of light source dies, a bond wire is attached from a top of the light source die to a further separate bond pad on the top surface of the wafer. At step 808a, the light detector sensor areas, the light source dies and the bond wires are encapsulated in a light transmissive material, such as a clear epoxy. At step 810a, grooves are formed in the light transmissive material between the light detector sensor areas and adjacent light source dies. At step 812a, the grooves are filled and the light transmissive material is covered with an opaque material to form crosstalk barriers and peripheral barriers. The opaque material can be, e.g., an opaque solder mask material, but is not limited thereto. At step 814, apertures are opened above the light detector sensor areas and the light source dies. At step 816, backgrinding is performed on a bottom of the wafer to achieve a specified thickness for the wafer. At step 818, solder balls or other electrical connectors are mounted to the bottom of the wafer. At step 820, dicing of the wafer is performed to separate the wafer into a plurality of optoelectronic devices, each of which includes at least one of the light detector sensor areas and at least one of the light source dies.

Referring now to FIG. 8B, at step 802, TSV processing is performed on a wafer that includes a plurality of light detector sensor areas to thereby form a plurality of partial depth vias. At step 804, each of the light source dies is attached to a separate bond pad on a top surface of the wafer. At step 806, for each of the plurality of light source dies, a bond wire is attached from a top of the light source die to a further separate bond pad on the top surface of the wafer. At step 808b, the light detector sensor areas, the light source dies and the bond wires are encapsulated in an opaque material. At step 809b, portions of the opaque material that cover the light detector sensor areas, the light source dies and the bond wires are removed, and portions of the opaque material between the light detector sensor areas and adjacent light source dies are left, to thereby form crosstalk barriers and peripheral barriers. At step 810b, the light detector sensor areas, the light source dies and the bond wires are encapsulated in a light transmissive material. At step 812b, the light transmissive material is covered with an opaque material. At step 814, apertures are opened above the light detector sensor areas and the light source dies. At step 816, backgrinding is performed on a bottom the wafer to achieve a specified for the wafer. At step 818, solder balls or other electrical connectors are mounted to the bottom of the wafer. At step 820, dicing of the wafer is performed to separate the wafer into a plurality of optoelectronic devices, each of which includes at least one of the light detector sensor areas and at least one of the light source dies.

Additional details of the methods described with reference to FIGS. 8A and 8B can be appreciated from the above discussion of FIGS. 2-4.

Figure 9:
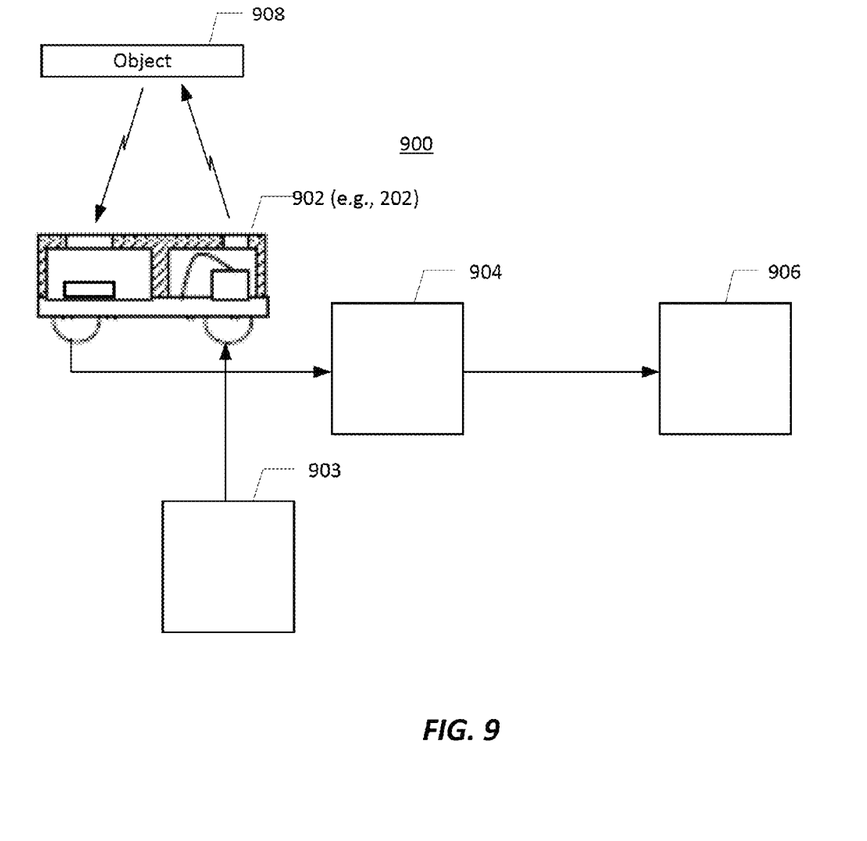
FIG. 9 is a high level block diagram of a system according to an embodiment of the present invention.

Optoelectronic devices of embodiments of the present invention can be used in various systems, including, but not limited to, mobile-phones and other handheld-devices. Referring to a system 900 of FIG. 9, for example, an optoelectronic device 902 (e.g., 202) can be used to control whether a subsystem 906 (e.g., a touch-screen, backlight, virtual scroll wheel, virtual keypad, navigation pad, etc.) is enabled or disabled. For example, the optoelectronic device 902 can detect when an object 908, such as a person's finger, is approaching, and based on the detection either enable or disable the subsystem 906. More specifically, a driver 903 selectively drives a light source die (e.g., 216) of the optoelectronic device 902, thereby causing the light source die to emit light that reflects off of the object 908. The driver 903 can be external to the device 902, as shown, or part of the device 902 (e.g., part of one of the dies of the device 902). A portion of the reflected light is detected by a light detector sensor region (e.g., 306) of a light source die of the optoelectronic device 902. An output of the optoelectronic device 902 is provided to a comparator or processor 904 which can compare the output of the optoelectronic device 902 to a threshold, to determine whether the object 908 is within a range where the subsystem 906 should be enabled or disabled, depending on what is desired. Multiple thresholds can be used, and more than one possible response can occur based on the detected proximity of the object 908. For example, a first response can occur if the object 908 is within a first proximity range, and a second response can occur if the object 908 is within a second proximity range. In the system 900, the optoelectronic device 902 is being used to detect the proximity of the object 908, and thus, the device 902 can also be referred to as an optical proximity sensor.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A method for fabricating a plurality of optoelectronic devices, comprising:
   performing through silicon via (TSV) processing on a wafer that includes a plurality of light detector sensor areas to thereby form a plurality of partial depth vias;
   encapsulating the light detector sensor areas in a light transmissive material;
   backgrinding a bottom of the wafer to achieve a specified thickness for the wafer;
   mounting solder balls or other electrical connectors to the bottom of the wafer; and
   dicing the wafer to separate the wafer into a plurality of optoelectronic devices, each of which includes at least one of the light detector sensor areas.

2. The method of claim 1, further comprising, after performing the TSV processing, but prior to the encapsulating, the backgrinding, the mounting and the dicing:
   attaching each of a plurality of light source dies to a separate bond pad on a top surface of the wafer;
   wherein the encapsulating also includes encapsulating the light source dies in the light transmissive material.

3. The method of claim 2, further comprising, after performing the TSV processing and the attaching the plurality of light sensor dies, but prior to the encapsulating, the backgrinding, the mounting and the dicing:
   for each of the plurality of light source dies, attaching a bond wire from a terminal on a top of the light source die to a further separate bond pad on the top surface of the wafer;
   wherein the encapsulating also includes encapsulating the bond wires in the light transmissive material.

4. The method of claim 2, further comprising, after performing the TSV processing, the attaching the plurality of light sensor dies and the encapsulating:
   forming grooves in the light transmissive material between the light detector sensor areas and adjacent light source dies;
   filling the grooves and covering the light transmissive material with an opaque material to form crosstalk barriers and peripheral barriers; and
   opening apertures above the light detector sensor areas and the light source dies.

5. The method of claim 4, wherein the opening apertures is performed using photolithography.

6. The method of claim 1, wherein:
   the light transmissive material comprises a clear epoxy.

7. The method of claim 4, wherein:
   the opaque material comprises an opaque solder mask material.

8. The method of claim 1, wherein the encapsulating is performed using liquid compression molding.

9. The method of claim 1, wherein the encapsulating is performed using clear solder mask deposition.

10. A method for fabricating a plurality of optoelectronic devices, comprising:
    performing through silicon via (TSV) processing on a wafer that includes a plurality of light detector sensor areas to thereby form a plurality of partial depth vias;
    encapsulating the light detector sensor areas in an opaque material;
    removing portions of the opaque material that cover the light detector sensor areas;
    encapsulating the light detector sensor areas in a light transmissive material;
    covering the light transmissive material with an opaque material that can be the same as, or different than, the opaque material used in the step of encapsulating the light detector sensor areas in an opaque material;
    opening apertures above the light detector sensor areas;
    backgrinding a bottom of the wafer to achieve a specified thickness for the wafer;
    mounting solder balls or other electrical connectors to the bottom of the wafer; and
    dicing the wafer to separate the wafer into a plurality of optoelectronic devices, each of which includes at least one of the light detector sensor areas.

11. The method of claim 10, further comprising, after performing the TSV processing:
    attaching each of a plurality of light source dies to a separate bond pad on a top surface of the wafer;
    wherein the encapsulating the light detector sensor areas in an opaque material also includes encapsulating the light source dies in the light transmissive material;
    wherein the removing portions of the opaque material that cover the light detector sensor areas also includes removing portions of the opaque material that cover the light source dies;
    wherein the encapsulating the light detector sensor areas in a light transmissive material also includes encapsulating the light source dies in the light transmissive material;
    wherein the opening apertures above the light detector sensor areas also includes opening apertures above the light source dies.

12. The method of claim 11, wherein the removing portions of the opaque material that cover the light detector sensor areas and the light source dies includes leaving portions of the opaque material between the light detector sensor areas and adjacent light source dies to thereby form the crosstalk barriers and peripheral barriers.

13. The method of claim 12, further comprising, after performing the TSV processing and the attaching the plurality of light sensor dies, but prior to the encapsulating the light detector sensor areas and the light source dies in the opaque material:
    for each of the plurality of light source dies, attaching a bond wire from a terminal on a top of the light source die to a further separate bond pad on the top surface of the wafer;
    wherein the encapsulating the light detector sensor areas and the light source dies in the opaque material also includes encapsulating the bond wires in the light transmissive material.

14. The method of claim 11, wherein:
    the encapsulating the light detector sensor areas and the light source dies in an opaque material is performed using opaque solder mask deposition.

15. The method of claim 11, wherein:
    the encapsulating the light detector sensor areas and the light source dies in a light transmissive material is performed using liquid compression molding.

16. The method of claim 11, wherein the removing and the opening is performed using photolithography.

17. The method of claim 10, wherein:
    the light transmissive material comprises a clear epoxy.

18. The method of claim 10, wherein:
    the opaque material, used in at least one of the steps of encapsulating the light detector sensor areas in an opaque material or covering the light transmissive material with an opaque material, comprises an opaque solder mask material.

19. A method for fabricating a plurality of optoelectronic devices, comprising:
- (a) attaching each of a plurality of light source dies to a separate bond pad on a top surface of a wafer that includes a plurality of light detector sensor areas;
- (b) forming crosstalk barriers between light detector sensor areas and adjacent light source dies before or after encapsulating the light detector sensor areas and the light source dies in a light transmissive material;
- (c) mounting electrical connectors to a bottom of the wafer; and
- (d) dicing the wafer to separate the wafer into a plurality of optoelectronic devices, each of which includes at least one of the light detector sensor areas and at least one of the light source dies.

20. The method of claim 19, wherein step (b) includes:
- (b.1) encapsulating the light detector sensor areas and the light source dies in the light transmissive material;
- (b.2) forming grooves in the light transmissive material between the light detector sensor areas and adjacent light source dies;
- (b.3) filling the grooves and covering the light transmissive material with an opaque material to form the crosstalk barriers; and
- (b.4) opening apertures above the light detector sensor areas and the light source dies.

21. The method of claim 19, wherein step (b) includes:
- (b.1) encapsulating the light detector sensor areas and the light source dies in an opaque material;
- (b.2) removing portions of the opaque material that cover the light detector sensor areas and the light source dies, and leaving portions of the opaque material between the light detector sensor areas and adjacent light source dies to thereby form the crosstalk barriers; and
- (b.3) encapsulating the light detector sensor areas and the light source dies in the light transmissive material.

22. The method of claim 21, wherein step (b) further includes:
- (b.4) covering the light transmissive material with an opaque material that can be the same as, or different than, the opaque material used at the step (b.1) of encapsulating the light detector sensor areas and the light source dies in an opaque material; and
- (b.5) opening apertures above the light detector sensor areas and the light source dies.

23. The method of claim 19, further comprising, after step (a), but before steps (b), (c) and (d):
- for each of the plurality of light source dies, attaching a bond wire from a top of the light source die to a further separate bond pad on the top surface of the wafer.

* * * * *